(12) United States Patent
Tang et al.

(10) Patent No.: US 11,031,455 B2
(45) Date of Patent: Jun. 8, 2021

(54) OLED TILED DISPLAY AND A RELATED TILING METHOD

(71) Applicant: Wuhan China Star Optoelectronics Technology Co., Ltd., Hubei (CN)

(72) Inventors: Yuejun Tang, Hubei (CN); Yang Chen, Hubei (CN); Dandan Liu, Hubei (CN); Xiaohui Jiang, Hubei (CN); Tsungying Yang, Hubei (CN); Dejiun Li, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 500 days.

(21) Appl. No.: 16/068,867

(22) PCT Filed: Apr. 4, 2018

(86) PCT No.: PCT/CN2018/081887
§ 371 (c)(1),
(2) Date: Jul. 9, 2018

(87) PCT Pub. No.: WO2019/178894
PCT Pub. Date: Sep. 26, 2019

(65) Prior Publication Data
US 2021/0083040 A1    Mar. 18, 2021

(30) Foreign Application Priority Data
Mar. 23, 2018 (CN) .......................... 201810247731.4

(51) Int. Cl.
*H01L 27/32* (2006.01)
*H01L 51/52* (2006.01)
*H01L 51/56* (2006.01)

(52) U.S. Cl.
CPC ...... *H01L 27/3293* (2013.01); *H01L 51/5246* (2013.01); *H01L 51/5253* (2013.01); *H01L 51/5259* (2013.01); *H01L 51/56* (2013.01)

(58) Field of Classification Search
None
See application file for complete search history.

(56) References Cited

U.S. PATENT DOCUMENTS 10,541,280 B1 * 1/2020 Krah ..................... G06F 3/0412
2008/0144173 A1   6/2008 Bae et al.
(Continued)

FOREIGN PATENT DOCUMENTS

CN       102484123 A    5/2012
CN       105788464 A    7/2016
(Continued)

*Primary Examiner* — Hsien Ming Lee
(74) *Attorney, Agent, or Firm* — Leong C. Lei

(57) ABSTRACT

The OLED tiled display includes front and back lighting display units that emitting lights toward each other. The front lighting display unit includes a first substrate and a first organic light emitting device. The back lighting display unit includes a second substrate and a second organic light emitting device. The first and second light emitting devices neighbor laterally on each other, but are vertically aligned to a second extended section of the second substrate and a first extended section of the first substrate, respectively. The present invention achieves small gaps and resolves the problem of obvious gaps in an OLED tiled display by piecing together the front and back lighting display units, where the substrate of the front lighting display unit functions as encapsulation layer to the back lighting display unit, and the substrate of the back lighting display unit functions as encapsulation layer to the front lighting display unit.

16 Claims, 3 Drawing Sheets

(56) References Cited

U.S. PATENT DOCUMENTS

2016/0014882 A1\* 1/2016 Jongman ................ H05K 1/028
　　　　　　　　　　　　　　　　　　　　361/749
2017/0277310 A1\* 9/2017 Xiong ................. G06F 3/04164

FOREIGN PATENT DOCUMENTS

| CN | 106409249 A | 2/2017 |
| JP | 2004-251981 A | 9/2004 |
| KR | 10-2015-0078046 A | 7/2015 |

\* cited by examiner

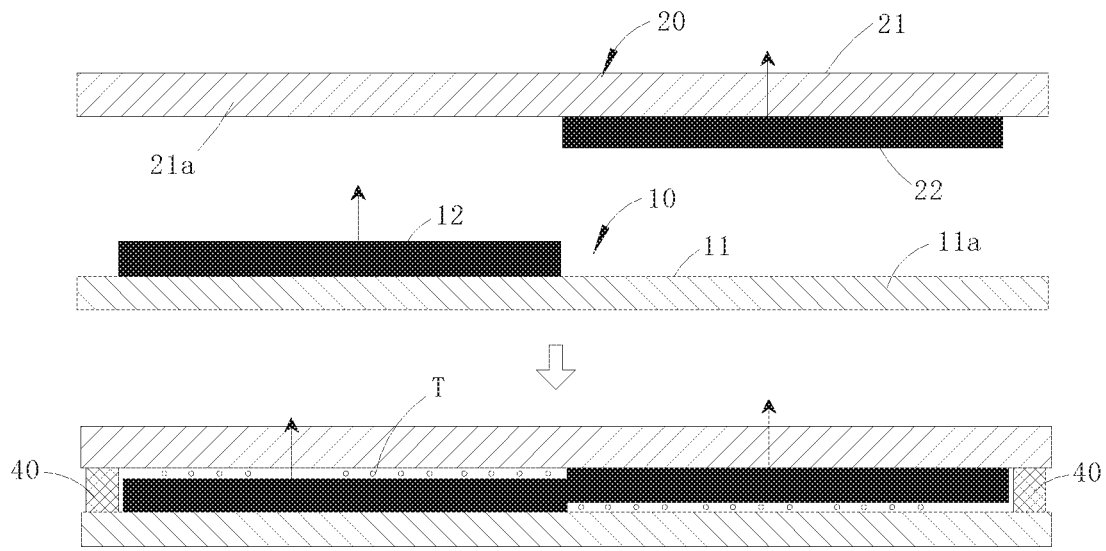

FIG. 1

```
┌─────────────────────────────────┐
│ Providing a front lighting display unit │── S01
│ and the back lighting display unit │
└─────────────────────────────────┘
                │
                ▼
┌─────────────────────────────────────────┐
│ Aligning the first light emitting device with the │── S02
│ second extended section, and the second light  │
│ emitting device with the first extended section │
└─────────────────────────────────────────┘
                │
                ▼
┌─────────────────────────────────────────┐
│ Applying adhesive along the rims and between │── S03
│ the first and second substrates             │
└─────────────────────────────────────────┘
```

FIG. 2

OLED TILED DISPLAY AND A RELATED TILING METHOD

RELATED APPLICATIONS

The present application is a National Phase of International Application Number PCT/CN2018/081887, filed Apr. 4, 2018, and claims the priority of China Application No. 201810247731.4, filed Mar. 23, 2018.

BACKGROUND OF THE INVENTION

1. Technical Field of the Invention

The present invention is generally related to organic light emitting diode (OLED) display technologies, and more particular to an OLED tiled display and a related method of tiling OLED displays.

2. Description of the Prior Art

It is difficult and challenging to make large and ultra-large OLED displays. A workaround is to tile two or more smaller displays into a large or ultra-large display.

In the large or ultra-large display, however, gaps between the smaller displays are inevitable, and a viewer therefore would perceive a partitioned image from the tiled display. In addition, in order to guarantee the operation life of OLED displays, encapsulation is required to prevent moist from entering their light emitting areas, and therefore their bezels require a certain width for the configuration of encapsulation material. Tiling OLED displays into a large or ultra-large display would especially suffer the problem of obvious gaps due to the wider bezels of the OLED displays.

SUMMARY OF THE INVENTION

To obviate the shortcomings of the prior art, the present invention teaches an OLED tiled display and a related tiling method for the OLED tiled display so as to achieve small gaps and to resolve the problem of obvious gaps of the OLED tiled display.

To achieve the objective, the OLED tiled display includes a front lighting display unit and a back lighting display unit that emit lights toward each other. The front lighting display unit includes a first substrate and a first organic light emitting device. The back lighting display unit comprises a second substrate and a second organic light emitting device. The first substrate includes a first main section whose front side has the first light emitting device configured and a first extended section laterally extended from the main section. The second substrate includes a second main section whose back side has the second light emitting device configured and a second extended section laterally extended from the main section. The first and second light emitting devices laterally neighbor on each other. The first light emitting device is vertically aligned with the second extended section of the second substrate, and the second light emitting device is vertically aligned with the first extended section of the first substrate.

The first and second organic light emitting devices have their lateral sides that are adjacent to each other partially attached.

Alternatively, both the first and second organic light emitting devices have wiring sections at their lateral sides. The wiring sections are perpendicular to the first substrate, and the wiring section of the first organic light emitting device has a projection towards the second organic light emitting device at least partially overlapped with the wiring section of the second organic light emitting device.

The OLED tiled display further comprises barrier layers covering external surfaces of the first and second organic light emitting devices, respectively.

The barrier layers may have a thinner width along the lateral sides of the first and second organic light emitting devices that are adjacent to each other, and a greater width along the lateral sides of the first and second organic light emitting devices that are away from each other.

The barrier layers may cover the upper side of the first extended section and the bottom side of the second extended section.

A filler may be applied to fill up the space between the first organic light emitting device and the second extended section, or the space between the second organic light emitting device and the first extended section.

The filler is adhesive or desiccant.

Another objective of the present invention is to provide a tiling method for the above-described OLED tiled display. The tiling method includes the following steps.

First, the front lighting display unit and the back lighting display unit are provided.

Then, the first light emitting device is aligned with the second extended section, and the second light emitting device is aligned with the first extended section, so that the first and second light emitting devices laterally neighbor on each other.

Finally, adhesive is applied along the rims and between the first and second substrates so as to encapsulate the first and second organic light emitting devices between the first and second substrates.

The tiling method further includes the step of covering external surfaces of the first and second organic light emitting devices by barrier layers, respectively, before applying adhesive along the rims and between the first and second substrates.

The present invention achieves small gaps and resolves the problem of obvious gaps in an OLED tiled display by piecing together the front and back lighting display units, where the substrate of the front lighting display unit functions as encapsulation layer to the back lighting display unit, and the substrate of the back lighting display unit functions as encapsulation layer to the front lighting display unit.

The foregoing objectives and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort.

FIG. 1 is a structural schematic diagram showing an OLED tiled display according to a first embodiment of the present invention.

FIG. 2 depicts a manufacturing process of the OLED tiled display of FIG. 1.

DETAILED DESCRIPTION OF THE PREFERRED EMBODIMENTS

Figure 3:
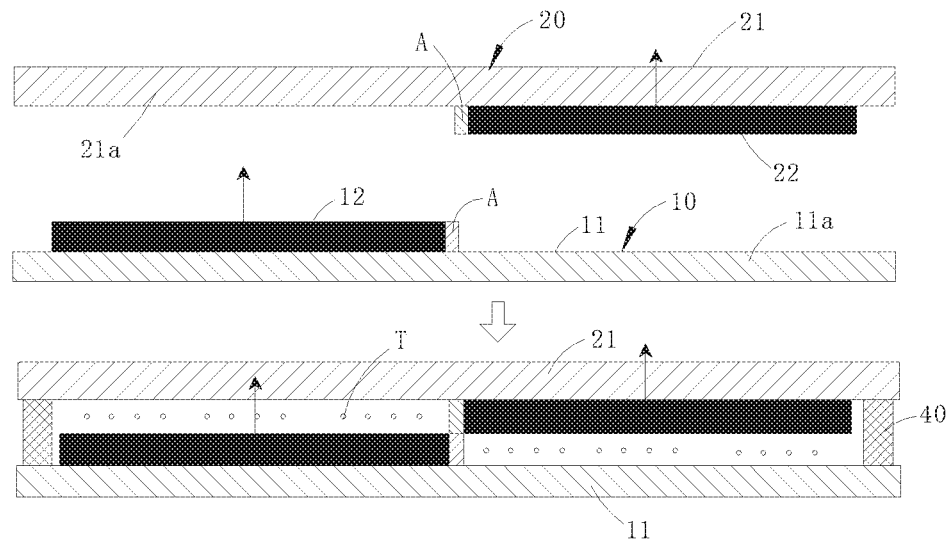
FIG. 3 depicts a manufacturing process of an OLED tiled display according to a second embodiment of the present invention.

The following descriptions are exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Embodiment 1

As shown in FIG. 1, an OLED tiled display according to the present embodiment includes a front lighting display unit 10 and a back lighting display unit 20, both emitting lights toward each other. The front lighting display unit 10 includes a first substrate 11 and a first organic light emitting device 12. The back lighting display unit 20 includes a second substrate 21 and a second organic light emitting device 22. The first substrate 11 includes a first main section (not numbered) whose front side has the first light emitting device 12 configured and a first extended section 11a laterally extended from the main section. The second substrate 21 includes a second main section (not numbered) whose back side has the second light emitting device 22 configured and a second extended section 21a laterally extended from the main section. The first and second light emitting devices 12 and 22 neighbor laterally on each other, but are vertically aligned with the second and first extended sections 21a and 11a, respectively.

The second substrate 21 of the back lighting display unit 20 is made of a translucent material. Because the first and second light emitting devices 12 and 22 are staggered, the translucent second extended section 21a functions as an encapsulation layer to the first light emitting device 12, and the translucent first extended section 11a functions as an encapsulation layer to the second light emitting device 22. As such, the side where the second substrate 21 is located would be the light emission side of the OLED tiled display.

The light from the front lighting display unit 10 or the back lighting display unit 20 is incident out of the light emission side toward a viewer, thereby achieving the OLED tiled display. In addition, by arranging the staggered first and second light emitting devices 12 and 22 as laterally close to each other as possible, extremely small or even zero gaps in the OLED tiled display may be achieved. The problem of obvious gap would be resolved.

It should be understandable that there is no limitation on the numbers of the front and back lighting display units 10 and 20 in the OLED tiled display, and small or zero gap may be achieved as long as they are pieced together as described above. Here the front and back lighting display units 10 and 20 are tiled in pairs. In other words, a first front lighting display unit 10 is opposite to a first back lighting display unit 20, a second front lighting display unit 10 is opposite to a second back lighting display unit 20, and so on. As such, a large or extra-large tiled display may be achieved with small or zero gaps.

The first extended section 11a of the front lighting display unit 10 functions as the encapsulation layer to the back lighting display unit 20, and the second extended section 21a functions as the encapsulation layer to the front lighting display unit 10. Therefore, there is no need to additionally design and produce separate encapsulation layers for the display units. All is required is to apply encapsulating or sealing adhesive to the exposed rims of those display units along the circumference of the OLED tiled display, and the air- and water-tightness of the OLED tiled display may be guaranteed.

To explain the principle of the present invention, the present embodiment describes the display units of the OLED tiled display. As a summary, each of front and back lighting display units 10 and 20 includes a substrate and an OLED device. The first substrate 11 may be a glass substrate, a thin metallic plate, and may be made of a polymer material such as polyimide (PI), polycarbonate (PC), etc. The second substrate 21 is translucent and may be a glass substrate or made of a polymer material such as polyimide (PI), polycarbonate (PC), etc. The first and second organic light emitting devices 12 and 22 are light generation layers, and include thin film transistors (TFT), light generation material layers on the TFTs, and cathodes and anodes on the light generation material layers.

In the present embodiment, there is no bezel or arrangement for wiring at where two organic light emitting devices are pieced. The two organic light emitting devices therefore may be tightly close to each other, thereby achieving zero gap. When organic light emitting devices are formed on the substrates, the organic light emitting devices are not formed on the extended sections of the substrates. Therefore, the extended sections of the front and back lighting display units 10 and 20, while functioning as mutual encapsulation layers, do not affect their respective organic light emitting devices.

Especially, the first and second extended sections 11a and 21a of the front and back lighting display units 10 and 20 may be bended behind where the organic light emitting devise are formed. As such, in forming the organic light emitting devices, the equipment requires only a limited space to accommodate the bended substrates. Then, the first and second substrates 11 and 21 should preferably be made of one of the above mentioned materials that is flexible. Then, the bended extended sections 11a and 21a are restored their original lateral position before conducting a subsequent step to alight and join the two display units.

As shown in FIG. 1, the light generation layers (i.e., the first and second organic light emitting devices 12 and 22) are arranged side-by-side along the OLED tiled display's thickness direction. The first and second organic light emitting devices 12 and 22 have one of their lateral sides faced each other and partially attached. Preferably, the two light generation layers should have their centers located at a same lateral level. That is, the centers of the first and second organic light emitting devices 12 and 22 are on a line parallel to the first substrate 11. Alternatively, it is the light generation material layers of the two light generation layers that are at the same level. That is, the centers of the light generation material layers of the first and second organic light emitting devices 12 and 22 are on a line parallel to the first substrate 11. Under this scenario, a filler T, such as adhesive or desiccant, may fill up the space between the extended sections (i.e., the first and second extended sections 11a and 21a) and the oppositely positioned light generation layers (i.e., the second and first organic light emitting devices 22 and 12).

As shown in FIG. 2, a tiling method for the OLED tiled display of the present embodiment includes the following steps.

Step S01 provides a front lighting display unit 10 and a back lighting display unit 20.

Step S02 aligns the first light emitting device 12 with the second extended section 21a, and the second light emitting device 22 with the first extended section 11a, so that the first and second light emitting devices 12 and 22 laterally neighbor on each other. Specifically, the first and second organic light emitting devices 12 and 22 have their lateral sides faced each other and attached together so as to achieve zero gap.

Step S03 fills adhesive 40 along the rims and between the first and second substrates 11 and 21 so as to encapsulate the first and second organic light emitting devices 12 and 22 between the first and second substrates 11 and 21.

Optionally, before the adhesive 40 is applied, a filler T, such as adhesive or desiccant, is filled in the space between the first extended section 11a and the oppositely positioned second organic light emitting devices 22, and between the second extended section 21a and the oppositely positioned first organic light emitting device 12, so as to enhance the flatness, reliability, and water-tightness of the OLED tiled display.

Embodiment 2

As shown in FIG. 3, both the first and second organic light emitting devices 12 and 22 have wiring sections A at their lateral sides that are adjacent to each other. The wiring sections A are perpendicular to the first substrate 1l (i.e., along a vertical direction in FIG. 3), and the wiring section A of the first organic light emitting device 12 has a projection towards the second organic light emitting device 22 at least partially overlapped with the wiring section A of the second organic light emitting device 22. Then by perpendicularly stacking their wiring sections A, the gap between the first and second organic light emitting devices 12 and 22 could be reduced. Then, as such, there are spaces between the first organic light emitting device 12 and the second extended section 21a, and between the second organic light emitting device 22 and the first extended section 11a. These spaces may be filled by the filler T, such as adhesive or desiccant.

Embodiment 3

Figure 4:
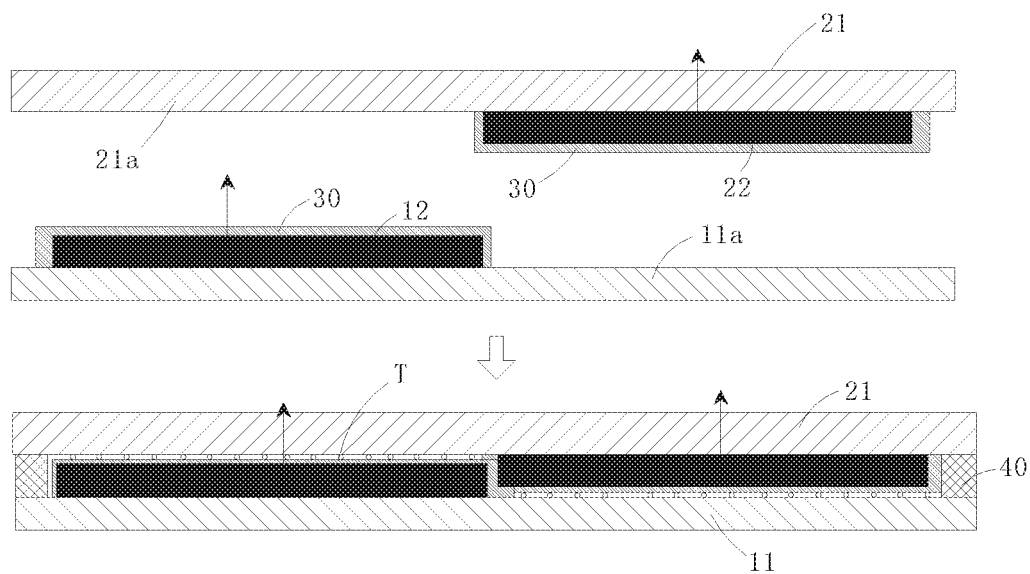
FIG. 4 depicts a manufacturing process of an OLED tiled display according to a third embodiment of the present invention.

As shown in FIG. 4, the present invention further includes barrier layers 30 that covers the external surfaces of the first and second organic light emitting devices 12 and 22, respectively, so as to prevent the permeation of moist and oxygen and to guarantee the operation life of the OLED tiled display. To achieve this OLED tiled display, the barrier layers 30 are formed covering the first and second organic light emitting devices 12 and 22 before applying adhesive 40 between the first and second substrates 11 and 21. The barrier layers 30 may be made of an inorganic material such as $SiO_2$, $SiN_x$, $SiN_xO_y$, $Al_2O_3$, $TiO_2$, etc., or an organic material such as a phenol polymeric derivative, acryl group polymer.

Figure 5:
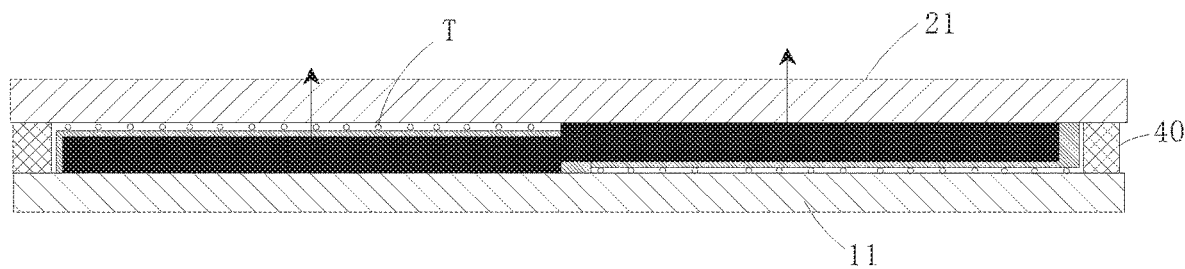
FIG. 5 is a structural schematic diagram showing another OLED tiled display according to the third embodiment of the present invention.

A more preferable embodiment is that the barrier layers 30 have a thinner width along the lateral sides that are adjacent to each other, and a greater width along the lateral sides away from each other, of the first and second organic light emitting devices 12 and 22. In other words, thicker barrier layers 30 around the OLED tiled display are configured, than those within the OLED tiled display, so as to prevent moist. Another alternative embodiment is shown in FIG. 5. What is depicted in FIG. 4 is that the barrier layers 30 completely cover first and second organic light emitting devices 12 and 22 and, therefore after the OLED tiled display is assembled, there are barrier layers 30 between the first and second organic light emitting devices 12 and 22. For the embodiment of FIG. 5, there is no barrier layer 30 along the lateral sides of the first and second organic light emitting devices 12 and 22 that are adjacent to each other. After the OLED tiled display is assembled, the lateral sides of the first and second organic light emitting devices 12 and 22 that are adjacent to each other are attached together.

Embodiment 4

Figure 6:
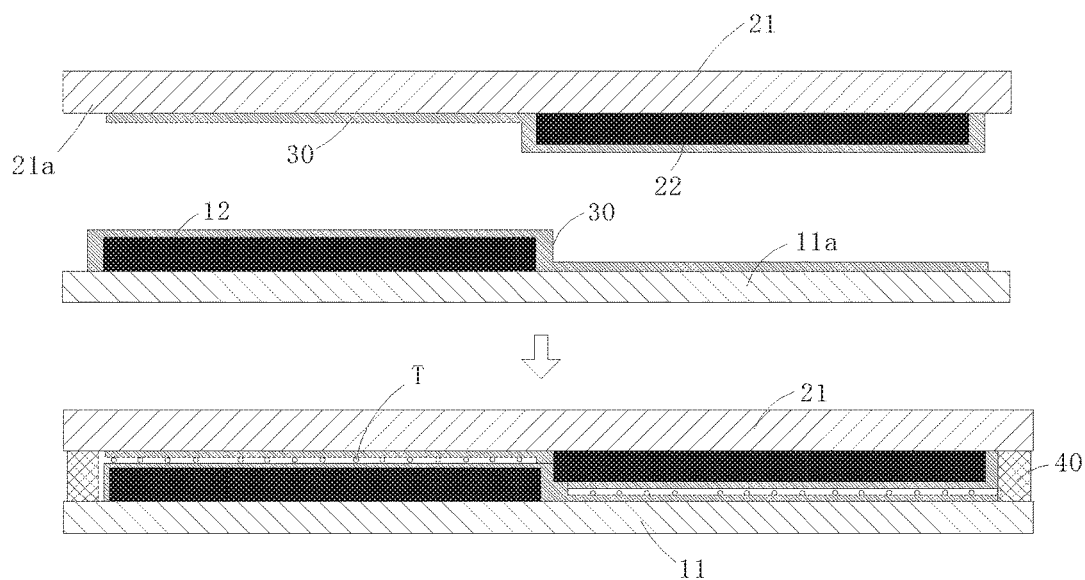
FIG. 6 depicts a manufacturing process of an OLED tiled display according to a fourth embodiment of the present invention.

As shown in FIG. 6, the present embodiment is different from the third embodiment in that the barrier layers 30 also cover the upper side of the first extended section 11a and the bottom side of the second extended section 21a. In other words, the barrier layer 30 on the first substrate 11 covers both the first organic light emitting device 12 and the side of first extended section 11a facing the second organic light emitting device 22, and the barrier layer 30 on the second substrate 21 covers both the second organic light emitting device 22 and the side of second extended section 21a facing the first organic light emitting device 12.

Figure 7:
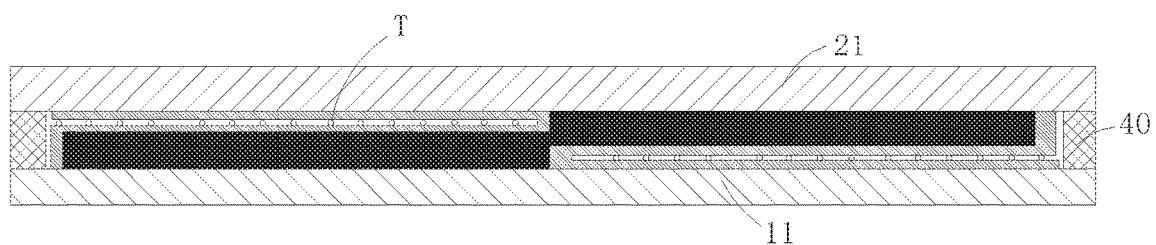
FIG. 7 is a structural schematic diagram showing another OLED tiled display according to the fourth embodiment of the present invention.

What is depicted in FIG. 6 is that the barrier layers 30 completely cover first and second organic light emitting devices 12 and 22 and, therefore after the OLED tiled display is assembled, there are barrier layers 30 between the first and second organic light emitting devices 12 and 22. As to the embodiment of FIG. 7, there is no barrier layer 30 along the lateral sides of the first and second organic light emitting devices 12 and 22 that are adjacent to each other. After the OLED tiled display is assembled, the lateral sides of the first and second organic light emitting devices 12 and 22 that are adjacent to each other are attached together. The filler T is filled in the space surrounded by the barrier layer 30 on the first organic light emitting device 12, the barrier layer 30 on the second extended section 21a, and the adhesive 40, and in the space surround by the barrier layer 30 on the second organic light emitting device 22, the barrier layer 30 on the first extended section 11a, and the adhesive 40.

The present invention achieves small gaps and resolves the problem of obvious gaps in an OLED tiled display by piecing together a front lighting display unit and a back lighting display unit, where the substrate of the front lighting display unit functions as encapsulation layer to the back lighting display unit, and the substrate of the back lighting display unit functions as encapsulation layer to the front lighting display unit.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the claims of the present invention.

What is claimed is:

1. An organic light emitting diode (OLED) tiled display, comprising a front lighting display unit and a back lighting display unit that emit lights toward each other; wherein
   the front lighting display unit comprises a first substrate and a first organic light emitting device;
   the back lighting display unit comprises a second substrate and a second organic light emitting device;
   the first substrate comprises a first main section whose front side has the first light emitting device configured and a first extended section laterally extended from the main section;
   the second substrate comprises a second main section whose back side has the second organic light emitting device configured and a second extended section laterally extended from the second main section;
   the first and second organic light emitting devices laterally neighbor on each other;
   the first organic light emitting device is vertically aligned with the second extended section of the second substrate; and
   the second organic light emitting device is vertically aligned with the first extended section of the first substrate;
   wherein both the first and second organic light emitting devices have wiring sections at their lateral sides; the wiring sections are perpendicular to the first substrate; and the wiring section of the first organic light emitting device has a projection towards the second organic light emitting device at least partially overlapped with the wiring section of the second organic light emitting device.

2. The OLED tiled display according to claim 1, wherein the first and second organic light emitting devices have their lateral sides that are adjacent to each other partially attached.

3. The OLED tiled display according to claim 2, wherein a filler fills up the space between the first organic light emitting device and the second extended section, or the space between the second organic light emitting device and the first extended section.

4. The OLED tiled display according to claim 3, wherein the filler is adhesive or desiccant.

5. The OLED tiled display according to claim 1, further comprising barrier layers covering external surfaces of the first and second organic light emitting devices, respectively.

6. The OLED tiled display according to claim 5, wherein the barrier layers have a thinner width along the lateral sides of the first and second organic light emitting devices that are adjacent to each other, and a greater width along the lateral sides of the first and second organic light emitting devices that are away from each other.

7. The OLED tiled display according to claim 5, wherein the barrier layers cover the upper side of the first extended section and the bottom side of the second extended section.

8. The OLED tiled display according to claim 5, wherein a filler fills up the space between the first organic light emitting device and the second extended section, or the space between the second organic light emitting device and the first extended section.

9. The OLED tiled display according to claim 8, wherein the filler is adhesive or desiccant.

10. The OLED tiled display according to claim 1, wherein a filler fills up the space between the first organic light emitting device and the second extended section, or the space between the second organic light emitting device and the first extended section.

11. The OLED tiled display according to claim 10, wherein the filler is adhesive or desiccant.

12. A tiling method for an OLED tiled display, where the OLED tiled display comprising a front lighting display unit and a back lighting display unit that emit lights toward each other, the front lighting display unit comprises a first substrate and a first organic light emitting device, the back lighting display unit comprises a second substrate and a second organic light emitting device, the first substrate comprises a first main section whose front side has the first organic light emitting device configured and a first extended section laterally extended from the main section, and the second substrate comprises a second main section whose back side has the second organic light emitting device configured and a second extended section laterally extended from the second main section, the tiling method comprising:
   providing the front lighting display unit and the back lighting display unit;
   aligning the first organic light emitting device with the second extended section, and the second organic light emitting device with the first extended section, so that the first and second organic light emitting devices laterally neighbor on each other;
   applying adhesive along the rims and between the first and second substrates so as to encapsulate the first and second organic light emitting devices between the first and second substrates; and
   covering external surfaces of the first and second organic light emitting devices by barrier layers, respectively, before applying adhesive along the rims and between the first and second substrates.

13. The tiling method according to claim 12, wherein the first and second organic light emitting devices have their lateral sides that are adjacent to each other partially attached.

14. The tiling method according to claim 12, wherein both the first and second organic light emitting devices have wiring sections at their lateral sides;
   the wiring sections are perpendicular to the first substrate; and the wiring section of the first organic light emitting device has a projection towards the second organic light emitting device at least partially overlapped with the wiring section of the second organic light emitting device.

15. The tiling method according to claim 12, wherein the barrier layers have a thinner width along the lateral sides of the first and second organic light emitting devices that are adjacent to each other, and a greater width along the lateral sides of the first and second organic light emitting devices that are away from each other.

16. The tiling method according to claim 12, wherein a filler fills up the space between the first organic light emitting device and the second extended section, or the space between the second organic light emitting device and the first extended section; and the filler is adhesive or desiccant.

* * * * *